United States Patent
Nakatani (10) Patent No.: US 7,583,537 B2
(45) Date of Patent: Sep. 1, 2009

(54) RECORDING DEVICE AND HDD BUILT-IN RECORDING DEVICE

(75) Inventor: Yoshio Nakatani, Daito (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 184 days.

(21) Appl. No.: 11/789,063

(22) Filed: Apr. 23, 2007

(65) Prior Publication Data

US 2007/0253259 A1    Nov. 1, 2007

(30) Foreign Application Priority Data

Apr. 26, 2006    (JP)    ............... 2006-121955

(51) Int. Cl.
*G11C 16/04* (2006.01)
(52) U.S. Cl. .................. 365/185.24; 365/185.33; 711/4; 711/102; 711/103; 711/112
(58) Field of Classification Search ........... 365/185.33, 365/185.24; 711/4, 102, 103, 112
See application file for complete search history.

(56) References Cited

U.S. PATENT DOCUMENTS

| | | | | |
|---|---|---|---|---|
| 2002/0083264 A1* | 6/2002 | Coulson | ............ | 711/112 |
| 2005/0066111 A1* | 3/2005 | Mantani | ............ | 711/103 |

FOREIGN PATENT DOCUMENTS

| | | |
|---|---|---|
| EP | 0392895 | 10/1990 |
| JP | H09-297659 A | 11/1997 |
| JP | 2003-303112 A | 10/2003 |
| JP | 2005-189907 | 7/2005 |
| JP | 2005-189907 A | 7/2005 |

OTHER PUBLICATIONS

Japanese Notice of the reason for refusal, dated May 14, 2008.
The extended European search report, pursuant to Rule 44a EPC dated Aug. 9, 2007, searched on Aug. 3, 2007.

* cited by examiner

*Primary Examiner*—VanThu Nguyen
*Assistant Examiner*—Eric Wendler
(74) *Attorney, Agent, or Firm*—Yokoi & Co., U.S.A., Inc.; Peter Ganjian (57) ABSTRACT

A recording device and an HDD built-in recording device each of which can curtail a use area of nonvolatile memory to be used even with the nonvolatile memory having a limit in the number of times of rewriting. In this HDD built-in recording device, a microcomputer 14 judges whether a program recorded in an HDD to be written into EEPROM 15 using a rewriting program and a history table recorded in the EEPROM 15. In doing this, the rewriting program increases the number of accesses in response to the increase in the number of times of rewriting into the EEPROM 15, and thereby restricts the number of programs to be written into the EEPROM 15 from the HDD 17.

2 Claims, 4 Drawing Sheets

| Name | Address | Access date and time | Frequency of use |
|------|---------|---------------------|------------------|
| A | Haaa | 2006/3/20 | 20 |
| B | Hbbb | 2006/2/20 | 50 |
| C | Rccc | 2006/2/20 | 100 |
| D | Rddd | 2006/3/20 | 60 |
| E | Reee | 2006/1/20 | 200 |
| F | Hfff | 2005/12/20 | 300 |

FIG. 4

RECORDING DEVICE AND HDD BUILT-IN RECORDING DEVICE

CROSS-REFERENCE TO RELATED APPLICATIONS

The present application is related to Japanese Patent Application No. 2006-121955, filed Apr. 26, 2006, the entire disclosure of which is expressly incorporated by reference herein.

BACKGROUND OF THE INVENTION

1. Field of the Invention

The present invention relates to a recording device, and specifically, to a recording device having an internal recording medium and an HDD built-in recording device having an internal recording medium.

2. Description of the Related Art

Conventionally, in the digital household appliance, a microcomputer acting as a control center controls constituent components according to predetermined software, and thereby realizes each function. Each piece of software that the microcomputer executes is recorded in nonvolatile memory, such as EEPROM (Electrically Erasable, Programmable Read-Only Memory). In recent years, since in the digital household appliance, the size of software becomes larger along with its higher functionality, the size of the nonvolatile memory that records the software also becomes larger similarly. Another factor that causes the size of the nonvolatile memory to be enlarged is as follows: in the case where the same product is intended to be sold in a region having a different language, a language menu for all regions to which the product is shipped has been recorded in the nonvolatile memory beforehand and the language menu is pre-selected by factory setting etc., and accordingly if the number of areas of shipment increases, regions of the language menu that are recorded in the nonvolatile memory increase so much.

Presently, although a cost of the nonvolatile memory has decreased as compared before, the nonvolatile memory having a memory size that allows large-size software to be recorded is still expensive. Besides, in order to support higher-functionality of the digital electric appliances in the future, it is presumed that the memory size of the volatile memory is going to increase.

The JP No. 2005-189907 A discloses, as a methods for suppressing memory size by curtailing the use of the nonvolatile memory, a technique of allocating a recording location to a program according to a frequency of use of the program by being equipped with ROM as nonvolatile memory, RAM as a recording medium, and a magnetic disk.

The technique provided by JP No. 2005-189907 A comes with the following problem. That is, the ROM (Read-only memory) as the nonvolatile memory has a limit in the number of times of rewriting. Because of this limit, when allocating the program to the recording location frequently according to the frequency of use, the number of times of rewriting is likely to soon reach the upper limit of the nonvolatile memory, and after that the function of allocating the program is likely to be unable to be executed.

BRIEF SUMMARY OF THE INVENTION

The present invention discloses a recording device capable of effectively curtailing memory capacity to be used even in nonvolatile memory that has a limit in the number of times of rewriting and an HDD built-in recording device of the same configuration.

As explained above, in this invention, an Hard Disc Drive built-in recording device, comprising: Electrically Erasable, Programmable Read-Only Memory for recording a predetermined program while limiting a number of times for rewriting; and a built-in HDD for recording the predetermined program;

the HDD built-in recording device allows a recorded program to be transferred between the EEPROM and the HDD based on an instruction from a microcomputer, the HDD includes a plurality of language programs that are recorded that correspond to a set of respective destinations and an image menu constituting an image on a menu screen as an initial setting in order to change a use language on the menu screen for each destination, the microcomputer creating a history table for recording a use history table in which a name of the program, a recording location, access date and time, and a number of accesses each time the program recorded in the HDD is accessed, the EEPROM records a rewriting program that makes the microcomputer perform determination whether the program recorded in the HDD is rewritten into the EEPROM by the microcomputer comparing the number of times of rewriting into the EEPROM and the data of the history table with predetermined thresholds, and the rewriting program makes the microcomputer perform the following processing:

if the microcomputer determines that the number of times of rewriting into the EEPROM is equal to or less than a first threshold indicating a predetermined number of times of rewriting, the microcomputer compares the number of accesses recorded in the history table corresponding to the recording program in a predetermined period with a second threshold indicating a predetermined number of accesses, and if it is determined that the number of accesses is more than the second threshold, the microcomputer outputs an instruction to rewrite the program into the EEPROM from the HDD, and if the microcomputer determines that the number of times of rewriting into the EEPROM is more than the first threshold, the microcomputer compares the number of times of rewriting into the EEPROM with a third threshold that is more than the first threshold, and if it is determined that the number of times of rewriting into the EEPROM is equal to or less than the third threshold, the microcomputer compares a total number of accesses recorded in the history table with a fourth threshold that is more than the second threshold, and if it is determined that the total number of accesses is more than the fourth threshold, the microcomputer outputs an instruction to rewrite the program into the EEPROM, if it is determined that the number of times of rewriting into the EEPROM is more than the third threshold, the microcomputer compares the number of accesses to the program recorded in the HDD with a fifth threshold that is more than the third threshold, and if it is determined that the number of times of rewriting is equal to or less than the fifth threshold, the microcomputer compares the number of times of rewriting with a sixth threshold that is more than the fourth threshold, and if it is determined the total number of accesses is more than the sixth threshold, the microcomputer outputs an instruction to rewrite the program into the EEPROM, and if it is determined that the total number of accesses is more than the fifth threshold, the microcomputer compares the total number of accesses with a seventh threshold that is more than the sixth threshold, and if it is determined that the total number of accesses is more than the seventh threshold, the microcomputer outputs an instruction to rewrite the program into the EEPROM, and the program that is determined to be rewritten into the EEPROM by the microcomputer is temporarily recorded in a Random-access memory and when the number of the programs recorded in the RAM reaches a predetermined number, the microcomputer outputs an instruction to rewrite the program into the EEPROM.

Provided that the recording device is configured as described above, the microcomputer judges whether a program recorded beforehand in the HDD should be recorded into the EEPROM based on the rewriting program recorded in the EEPROM and further on the formed history table. First, if the number of times of rewriting into the EEPROPM is equal to or less than the first threshold, the microcomputer determines the number of accesses to the program from the latest number of times recorded in the history table and compares it with the second threshold, and thereby judges whether the program is rewritten into the EEPROM from the HDD. On the other hand, if the number of times of rewriting into the EEPROM is more than the first threshold, the rewriting program compares the number of times of rewriting into the EEPROM with the third threshold and the fifth threshold, and compares the number of accesses to the program with the fourth threshold, the sixth threshold, and the seventh threshold depending on the third threshold and the fifth threshold. At this time, the number of accesses to the program increases correspondingly to the increase in the number of times of rewriting into the EEPROM. For this reason, as the number of times of rewriting into the EEPROM increases, only the program having a larger number of accesses is written into the EEPROM from the HDD, and consequently the number of programs written into the EEPROM decreases.

Moreover, in this invention, A recording device that includes nonvolatile memory for recording a predetermined program and having a limit in a number of times of rewriting and a recording medium for recording video and sound programs that allows a recorded program to be transferred between the nonvolatile memory and the recording medium, further comprising: a program use history recording unit for recording a use history of a program recorded in the nonvolatile memory and in the recording medium, and a program allocation unit that, when a frequency of use of the program reaches a predetermined value or more, records the program in the nonvolatile memory and, when the frequency of use of the program is equal to or less than a predetermined value, records the program in the recording medium, based on a use history that is recorded by the program use history recording unit.

When being configured as described above, since the program allocation unit records a program recorded in the nonvolatile memory or a recording medium in the nonvolatile memory based on a use history created by the program use history recording unit, even with the nonvolatile memory having the limit in the number of times of rewriting, curtailing the memory being used effectively makes it possible to lower a unit price of a product without increasing the memory capacity of the nonvolatile memory.

Then, in this invention, the program allocation unit is configured to determine the frequency of use based on the latest use history recorded by the use history recording unit when the number of times of rewriting into the nonvolatile memory is equal to or less than a predetermined number of times, and determines the frequency of use based on all the use histories recorded by the use history recording unit when the number of times of rewriting into the nonvolatile memory is more than a predetermined number of times.

When the recording device is configured as described above, since the frequency of use for recording a program in the nonvolatile memory is changed according to the number of times of rewriting into the nonvolatile memory, durability of the nonvolatile memory can be prolonged.

Moreover, in this invention, the recording medium has recorded a plurality of language programs according to destinations of the recording device concerned, and the program allocation unit is configured to allocate and record the language programs in either the nonvolatile memory or the recording medium based on the use histories of the language programs recorded by the program use history recording unit.

Provided that the program allocation unit is configured as described above, a capacity of the nonvolatile memory can be curtailed even in the case where language programs whose frequencies of use are low are recorded beforehand in order to support different destinations.

Moreover, in this invention, the program allocation unit is so configured as to, when after programs to be allocated is selected based on the use history, the number of the selected programs reaches a predetermined number, allocate and record the selected programs in either the nonvolatile memory or the recording medium.

In the case of the program allocation unit configured as described above, since a plurality of programs are written in the nonvolatile memory collectively, the number of times of rewriting in the nonvolatile memory can be reduced, and the durability of the nonvolatile memory can be extended further. Furthermore, it is natural that a more concrete configuration as of claim 1 plays the same work as those of claims 2 to 5 of the invention described above.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purpose of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

DETAILED DESCRIPTION OF THE INVENTION

The detailed description set forth below in connection with the appended drawings is intended as description of presently preferred embodiments of the invention and is not intended to represent the only forms in which the present invention may be constructed and or utilized.

Embodiments of this invention will be described based on an HDD built-in recording device as a concrete explanation of a recording device of this invention. However, this invention is not limited to the above-mentioned HDD built-in recording device and can be applied to any storage devices configured to be available for the invention. Hereafter, embodiments of this invention will be explained according to the following order.

Figure 1:
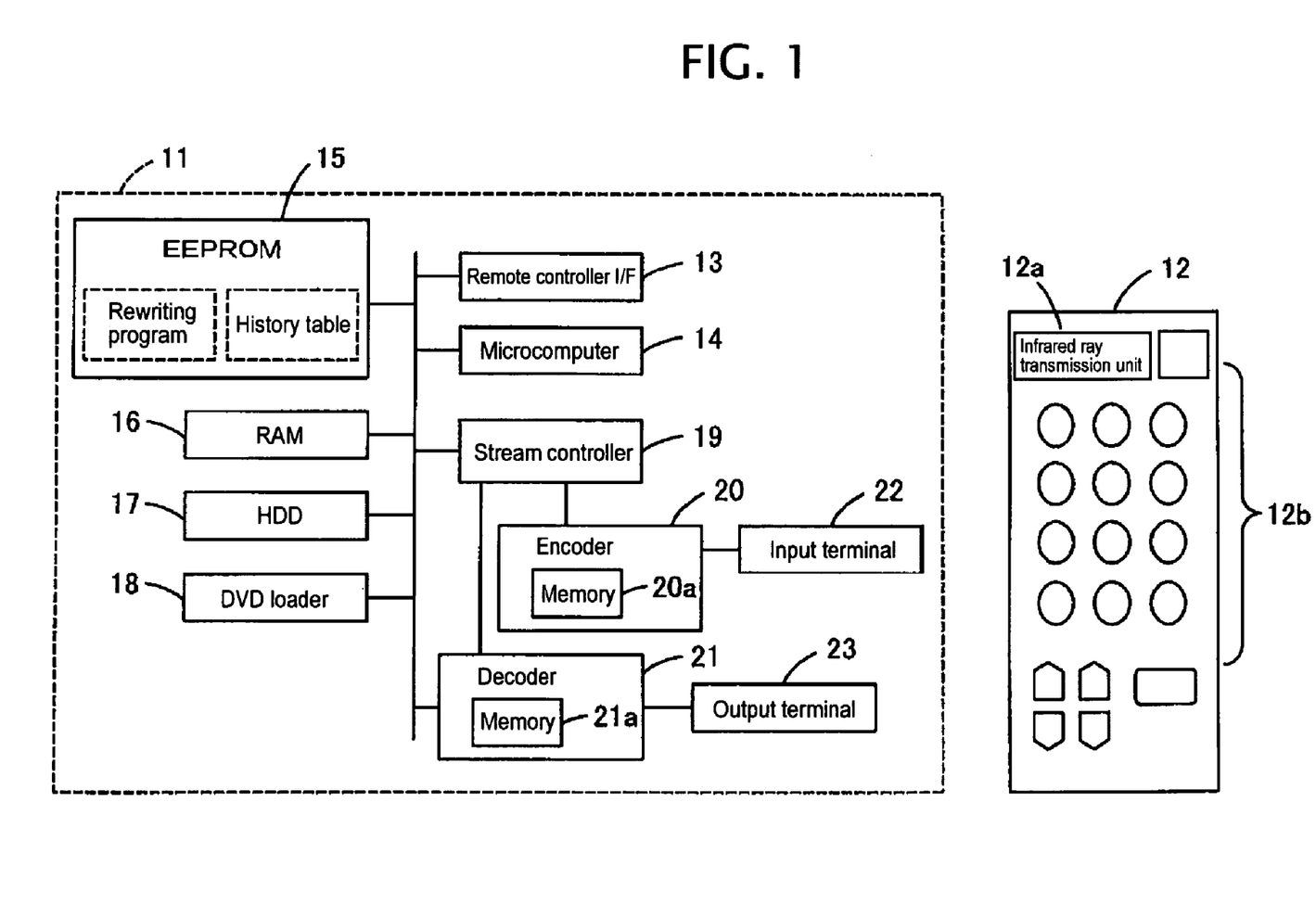
FIG. 1 is a diagram showing one example of an HDD built-in recording device.

(1) Configuration of HDD built-in recording device (2) A method for allocating programs
(3) Modifications
(4) Summary (1) Configuration of HDD Built-In Recording Device Hereafter, with reference to FIG. 1, FIG. 2, FIG. 3, and FIG. 4, the HDD built-in recording device that materializes the recording device according to this invention will be explained. FIG. 1 is a block diagram of the HDD built-in recording device. From the figure, an HDD built-in recording device 10 is configured to include a main body 11 and a remote controller 12. The main body 11 has a construction that has a remote controller interface (I/F) 13 for controlling the main body 11 based on operations of the remote controller 12, a microcomputer 14, EEPROM 15, RAM 16, a stream controller 19 for reading video and sound based on the control of the microcomputer 14, an HDD 17, an encoder 20, a decoder 21, a DVD loader 18, and an input terminal 22 and an output terminal 23 for connecting an external apparatus such as a TV apparatus.

The remote controller 12 has a construction that has an operation key 12b for outputting a predetermined operation signal based on pressing pressure on it, and an infrared ray transmission unit 12a for converting the operation signal resulting from the operation of the operation key 12b into an infrared signal and outputting it to the main body 11. When the infrared signal is outputted from the infrared ray transmission unit 12a by an operation of the remote controller 12, the remote controller I/F 13 receives the infrared signal, converts it into an operation signal again, and subsequently outputs the signal to the microcomputer 14. The microcomputer 14 receives the operation signal, and at the same time usually performs control according to the operation signal, following each program recorded in the EEPROM 15. Moreover, the microcomputer 14 uses the RAM 16 as a work table where it executes the program recorded in the EEPROM 15.

The main body 11 transfers a video signal and a sound signal between itself and an external apparatus, such as a TV apparatus, using the input terminal 22 and the output terminal 23. It is possible to record the video signal and the sound signal in the HDD 17, a medium loaded in the DVD loader 18, etc. of the main body 11 through the input terminal 22, and to display data recorded in the HDD 17, the medium of the DVD, etc. on the TV apparatus that is the external apparatus through the output terminal 23. A concrete function will be explained below.

When video from the TV apparatus is recorded, video/sound data outputted from the TV apparatus is outputted to the encoder 20 through the input terminal 22. The video/sound data is temporarily recorded in memory 20a in the encoder 20 and the encoder 20 compresses the video/sound data by the MPEG 2 method, after performing predetermined signal processing on the recorded video/sound data. The compressed video/sound data are outputted to the stream controller 19, and is recorded in either the HDD 17 or a DVD medium loaded in the DVD loader 18 following an instruction of the microcomputer 14.

When the video/sound data recorded in the HDD 17 or the DVD medium loaded in the DVD loader 18 is displayed on the TV apparatus, the video/sound data recorded in the HDD 17 or the DVD medium is read by the microcomputer 14, which outputs it to the stream controller 19. The video/sound data outputted to the stream controller 19 is outputted to the memory 21a in the decoder 21, and its compression in the MPEG form is canceled. The video/sound data whose compression is canceled is outputted to the TV apparatus through the output terminal 23. In addition, the stream controller 19 can record the video/sound data recorded in the HDD 17 into a DVD medium loaded in the DVD loader 18 based on an instruction of the microcomputer 14, or conversely can record the video/sound data recorded in a DVD medium into the HDD 17 instead.

The HDD built-in recording device 10 as one embodiment of this invention has recorded a plurality of programs in the HDD 17 as an initial setting. The programs recorded in the HDD 17 are language programs for respective destinations of the HDD built-in recording device 10, a video menu, etc. The language program is for changing a language displayed on the menu screen in order to display a menu screen by the OSD images displayed by operations of the remote controller 12 with a use language used in the destination. Therefore, the recording device records a plurality of language programs according to the number of destinations. Moreover, the image menu constitutes an explanation screen for explaining functions of this HDD built-in recording device 10 using OSD images. The program recorded in the HDD 17 by the initial setting is not limited to the above-mentioned, but can be set up according to a use.

Figure 2:
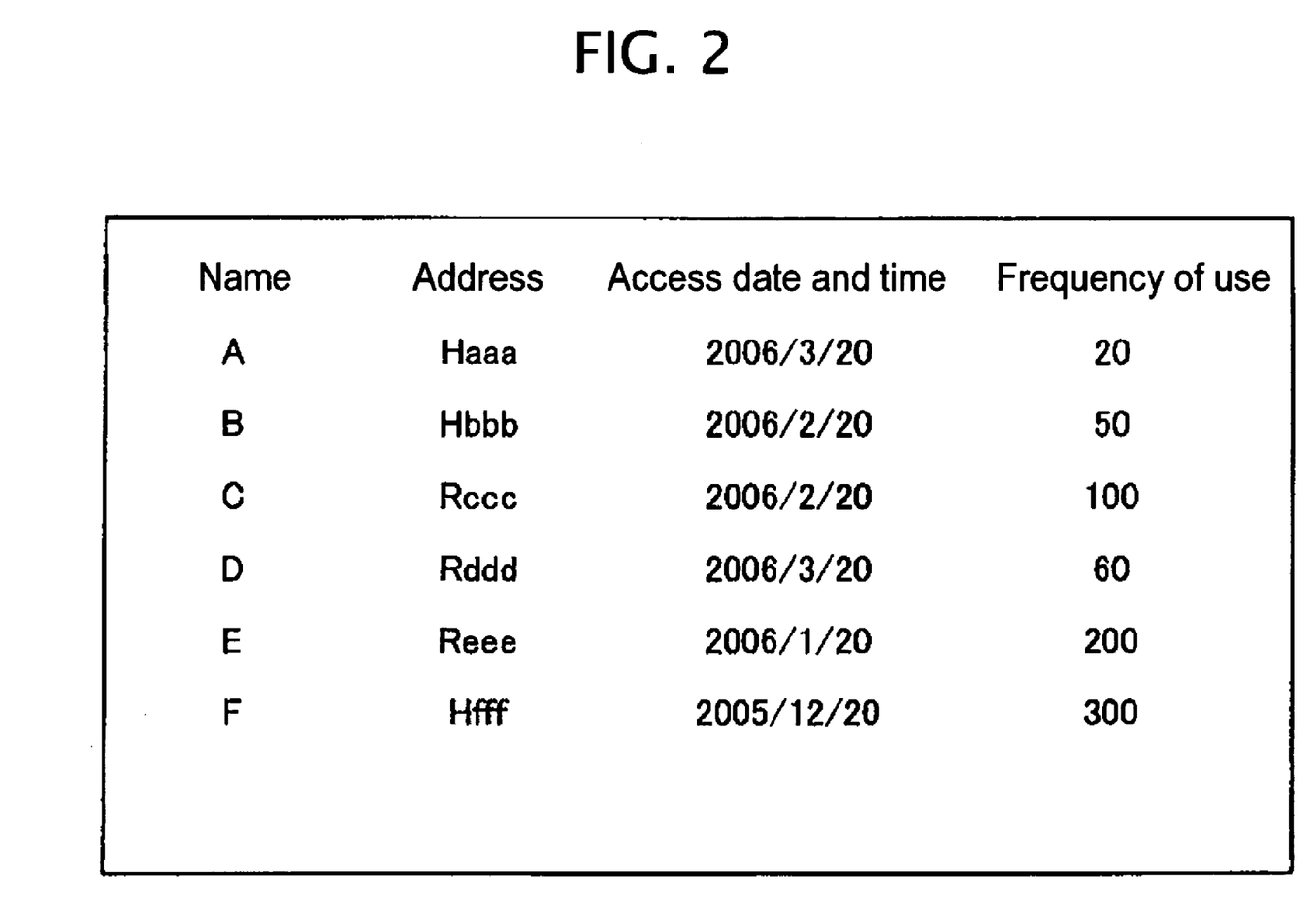
FIG. 2 is a diagram showing one example of a history table.

Each time an individual program recorded in the HDD 17 or the EEPROM 15 is accessed, the microcomputer 14 creates a history table for recording a use history that describes a name of a program, a recording location, access date and time, and the number of accesses are written, and records it into the EEPROM 15 or the RAM 16. FIG. 2 is a diagram showing one example of the history table. In the figure, the name of a program, the recording location (address), the access date and time, and the number of accesses (frequency of use) are written sequentially from the leftmost column. As an example, a program A is written on the top line and an address of the program A is recorded as Haaa. This indicates that it is recorded in an address aaa of the HDD 17. The latest access time of the program A is recorded as Mar. 20, 2006, and the number of accesses is 20 times. Updating of the history table is done by the microcomputer 14 each time a program is accessed. By doing so, the microcomputer 14 and the history table constitute a program use history recording unit.

Moreover, the microcomputer 14 can rewrite each program at a different recording location according to the frequency of use of the program. For this purpose, the HDD built-in recording device 10 has recorded a rewriting program for rewriting a program recorded in the HDD 17 into the EEPROM 15 being induced by comparison of the number of times of rewriting the EEPROM 15 and the history table with predetermined thresholds by the microcomputer 14. This realizes a program allocation unit with the microcomputer 14 and the rewriting program recorded in the EEPROM 15. A concrete explanation about rewriting the program at a different recording location according to the frequency of use will be given using the language programs described above. Rewriting of the program at a different recording location according to the frequency of use of the program that will be explained below is not limited to the language program, and can be altered according to the initial setting.

Figure 3:
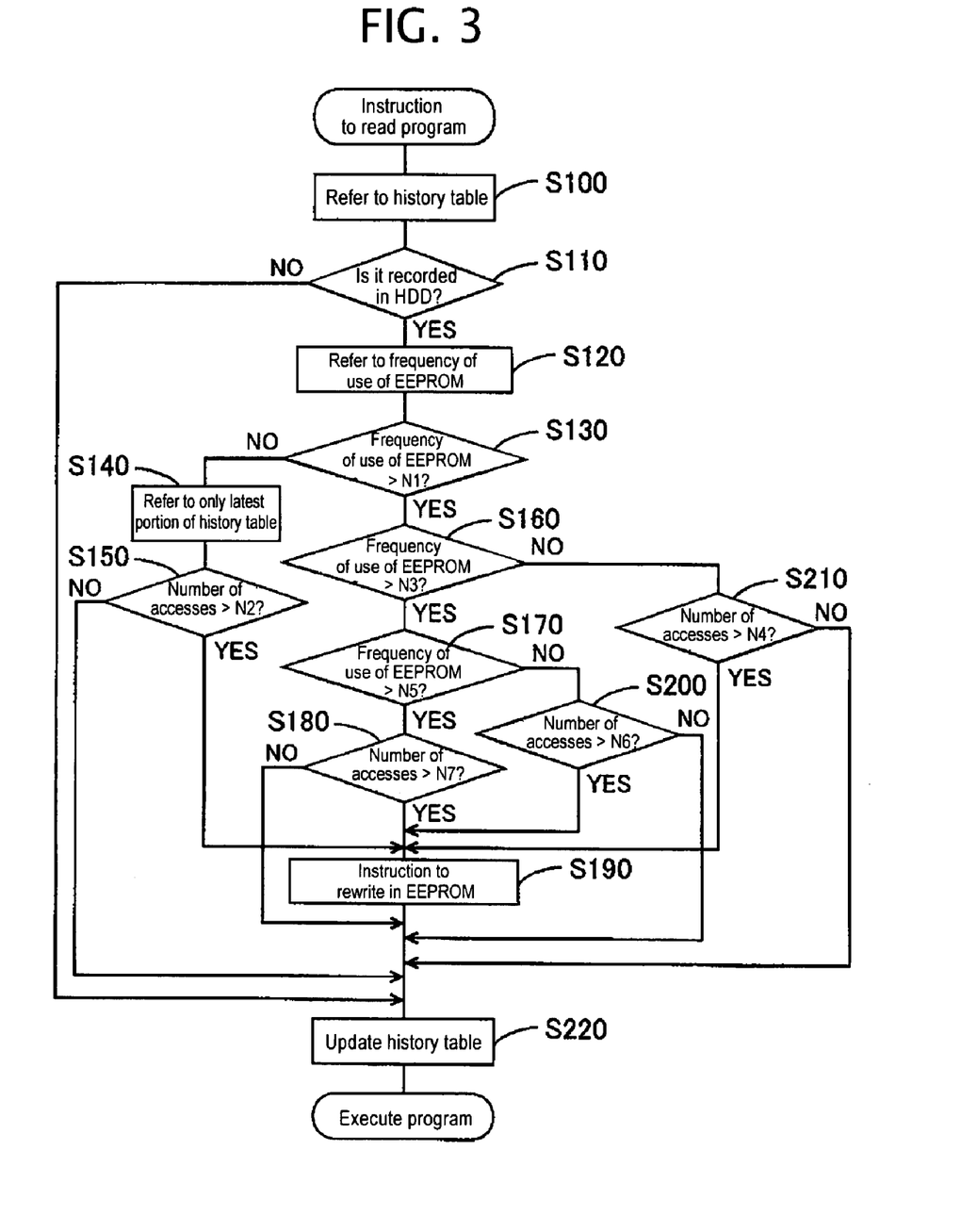
FIG. 3 is a flowchart showing one example of a rewriting program.

FIG. 3 is a flowchart of the rewriting program that the microcomputer 14 executes. In this figure, when an instruction to read a Japanese language program is outputted on the OSD screen based on an operation of the remote controller 12, the microcomputer 14, in response to the instruction, refers to the language program that is instructed to read on the history table recorded in the EEPROM 15 (Step S100). Next, the microcomputer 14 judges whether the program is recorded in the HDD 17 or the EEPROM 15, and when it is recorded in the EEPROM 15, the microcomputer 14 performs only updating of the history table (Step S220) and starts up the language program. When the language program is recorded in the HDD 17, the microcomputer 14 refers to the number of times of rewriting into the EEPROM 15 (Step S120). Then, the microcomputer 14 determines the rewriting of the program by comparing it with each threshold.

The HDD built-in recording device 10 of this invention compares the number of accesses with any of the second threshold (N2), a fourth threshold (N4), a sixth threshold (N6), and a seventh threshold (N7) each of which is a condition of recording the program into the EEPROM 15 and is selected by its magnitude with respect to a first threshold (N1), a third threshold (N3), and a fifth threshold (N5) that represent the respective numbers of times of rewriting the EEPROM 15. As one example, a case where the number of times of rewriting into the EEPROM 15 is equal to or less than 1000 times will be explained. First, the microcomputer 14 refers to the number of accesses on the history table recorded in the EEPROM 15 on access date and time in a predetermined period (Step S120). Next, the microcomputer 14 compares the number of times of rewriting into the EEPROM 15 with the threshold N1 (Step S130). Here, if N1 is a value of 1000 or more, the flow of the microcomputer 14 proceeds to Step S140. If the frequency of use of the program written in the history table is 10 times (N2) or more at Step S140, the microcomputer 14 gives an instruction to rewrite the program into the EEPROM 15 (Step S190).

By this procedure, after the program recorded in the HDD 17 is outputted to the stream controller 19, the program is rewritten into the EEPROM 15 from the HDD 17. When the rewriting is performed, the microcomputer 14 updates the history table (Step S220), and executes the program. Moreover, if the frequency of use is equal to or less than 10 times (N2) at Step S150, the microcomputer 14 updates only the history table (Step S220) and executes the program.

As the number of accesses to the table in a predetermined period described above, for example, a period ranging from this time back to one-month before is considered and the microcomputer 14 determines how many times the program is accessed in this period. The period is not limited to the above-mentioned period and only needs to be set up beforehand as the initial setting.

Next, when the number of times of rewriting into the EEPROM 15 is more than 1000 times (N1) at Step S130, the microcomputer 14 judges whether the number of times of rewriting recorded in the EEPROM 15 is more than a third threshold N3 (Step S160). As one example, let the third threshold N3 be 8000 times. At Step S160, if the microcomputer 14 determines that the number of times of rewriting into the EEPROM 15 is equal to or less than 8000 times (N3), it judges whether the number of accesses to the history table corresponding to the program is more than the fourth threshold N4 (Step S210).

At this time, it is specified that for a count of the number of accesses to each program, the total number of accesses in all the histories shall be referred to. By doing this, when the number of times of rewriting into the EEPROM 15 exceeds the predetermined number of times (N1), the total number of accesses recorded in the history table is specified to be considered, whereby a bias of the frequency of access can be eliminated and a rewriting life of the EEPROM 15 can be prolonged. If the microcomputer 14 determines that the total number of accesses to the program is more than the fourth threshold N4, the microcomputer 14 performs a series of operations of Step S190 and Step S220 and executes the program. On the other hand, if the microcomputer 14 determines that the total number of accesses is equal to or less than N4, it performs only updating of the history table at Step S190 and executes the program.

Similarly, at Step S160, if the microcomputer 14 determines that the number of times of rewriting into the EEPROM 15 is more than 8000 times (N3), the microcomputer 14 judges whether the number of times of rewriting into the EEPROM 15 is more than the fifth threshold N5 (Step S170). If the microcomputer 14 determines that the number of times of rewriting into the EEPROM 15 is more than the fifth threshold N5, it judges whether the total number of accesses to the program is more than the seventh threshold N7 (Step S180). If it determines that the total number of accesses to the program is more than the seventh threshold N7, the microcomputer 14 performs a series of operations of Step S190 and Step S220. If the microcomputer 14 determines that the total number of accesses is equal to or less than the seventh threshold N7, it starts up the program after the flow proceeds to Step S190.

Similarly, at Step S170, if the microcomputer 14 determines that the number of times of rewriting into the EEPROM 15 is equal to or less than the fifth threshold N5, it will judges whether the program is rewritten by comparing the total number of accesses to the program with the sixth threshold N6 (Steps S200, S190, S220). By the above procedure, only the language program corresponding to Japanese is rewritten into the EEPROM 15, and language programs corresponding to remaining languages are kept to be recorded in the HDD 14 because their frequencies of use are few.

Moreover, N4, N6, and N7 that are thresholds of the total number of accesses to the program have a relationship of N4>N6>N7. This is because the number of times of rewriting is restricted by increasing the total number of accesses that is a threshold serving as a base of determination of the rewriting as the number of times of rewriting into the EEPROM 15 increases (N1<N3<N5), so that the program is not rewritten into the EEPROM 15 until it reaches the limit of rewriting into the EEPROM. By this relationship, since as the number of times of rewriting increases, a threshold serving as a base for determination of rewriting becomes so much large in the EEPROM 15, the number of times of rewriting will decrease. By this mechanism, it becomes possible to prolong the rewriting life of the EEPROM 15.

(3) Modification

As described above, since the HDD built-in recording device 10 changes the recording destination of the program based on the frequency of use of the program considering the number of times of rewriting into the EEPROM 15, it can curtail the quantity used of the memory of the EEPROM 15. However, by devising the flow of the rewriting program further, it becomes to reduce the number of times of rewriting into the EEPROM 15, and to prolong further the rewriting life of the EEPROM 15.

Figure 4:
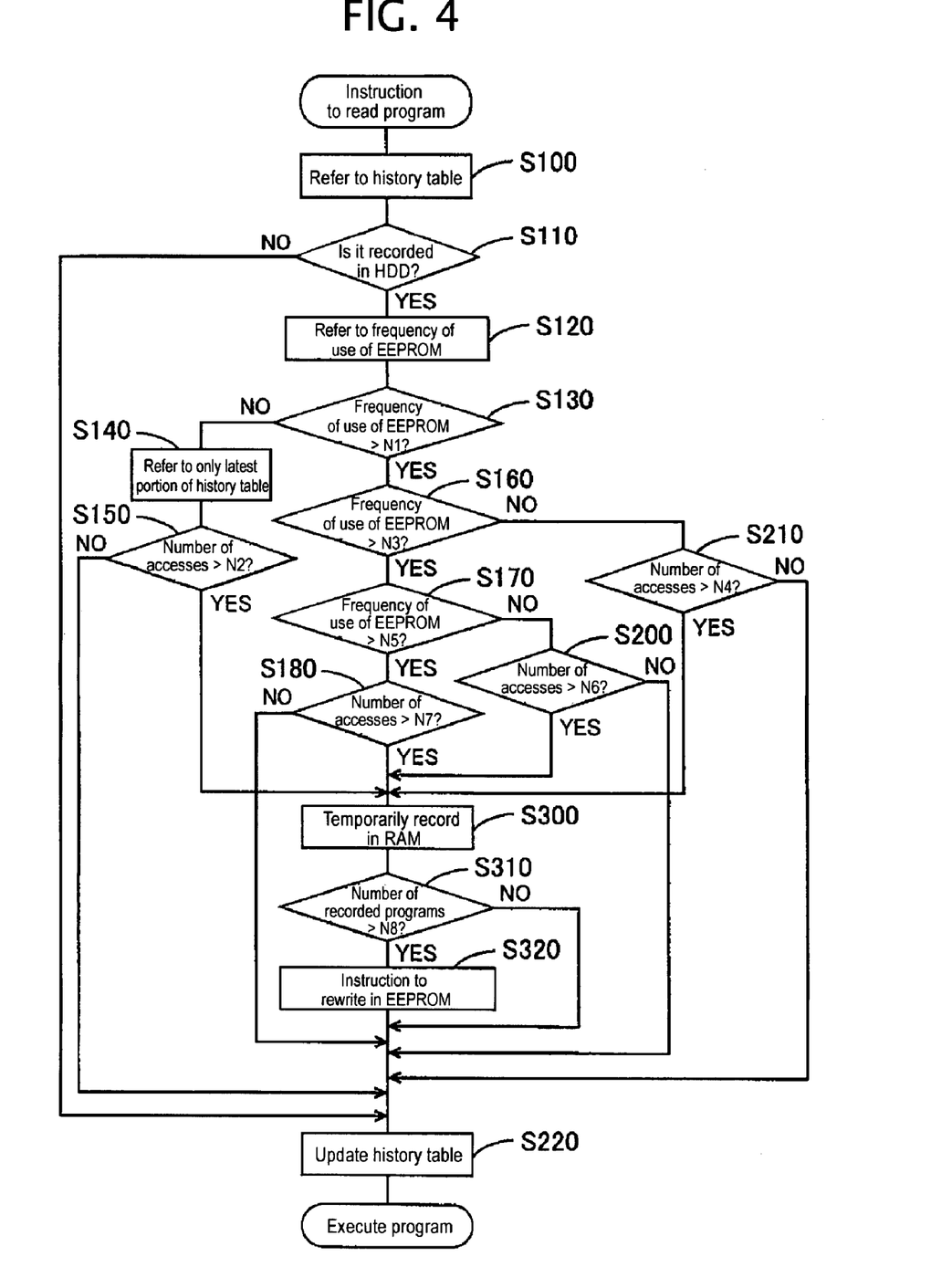
FIG. 4 is a flowchart showing a modification example as one example of the rewriting program.

FIG. 4 is a diagram showing a flowchart of the rewriting program in a modification in the one embodiment of this invention. Since this figure is the same as the flowchart of FIG. 3 from the start to Steps S150, S180, S200, and S210, explanation thereof will be omitted and newly added steps will be focused and explained below. In each step of Steps S150, S180, S200, and S210, when the microcomputer 14 determines that the program should be recorded into the EEPROM 15 based on the total number of accesses to the program, the microcomputer 14 temporarily records the program in the RAM 16 (Step S300). Next, until the number of the programs recorded in the RAM 16 reaches a predetermined number N8 or more, the microcomputer 14 does not record the programs into the EEPROM 15. Therefore, when the number of the programs recorded in the RAM 16 reaches N8 firstly, the microcomputer 14 performs rewriting of the programs into the EEPROM 15 collectively (Step S320).

By this technique, rewriting into the EEPROM 15 can be completed once for the programs that count N8, and accordingly the number of times of rewriting can be curtailed and it becomes possible to prolong the life of the EEPROM 15. In the modification described above, although the RAM 16 was used as a temporal recording location of the program, the temporal recording location is not limited to the RAM 16. Alternately, virtual memory may be constructed in the HDD 15, or new nonvolatile memory may be added.

In the one embodiment of this invention described above, the rewriting program is so constructed that the number of times of rewriting into the EEPROM 15 may decrease in rewriting the program into the EEPROM 15 from the HDD 17. However, the rewriting program may be such that, when the number of accesses is fewer, it records the program into the HDD based on the total number of accesses to the program recorded in the EEPROM 15.

(4) Summary

With the nonvolatile memory having a limit in the number of times of rewriting, in order to curtail a use area of the nonvolatile memory being used effectively, the microcomputer 14 judges whether the program recorded in the HDD 17 should be written into the EEPROM 15 using the rewriting program and the history table both recorded in the EEPROM 15.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

What is claimed is:

1. An Hard Disc Drive built-in recording device, comprising:
   Electrically Erasable, Programmable Read-Only Memory for recording a predetermined program while limiting a number of times for rewriting; and
   a built-in HDD for recording the predetermined program;
   the HDD built-in recording device allows a recorded program to be transferred between the EEPROM and the HDD based on an instruction from a microcomputer,
   the HDD includes a plurality of language programs that are recorded that correspond to a set of respective destinations and an image menu constituting an image on a menu screen as an initial setting in order to change a use language on the menu screen for each destination,
   the microcomputer creating a history table for recording a use history table in which a name of the program, a recording location, access date and time, and a number of accesses each time the program recorded in the HDD is accessed,
   the EEPROM records a rewriting program that makes the microcomputer perform determination whether the program recorded in the HDD is rewritten into the EEPROM by the microcomputer comparing the number of times of rewriting into the EEPROM and the data of the history table with predetermined thresholds, and
   the rewriting program makes the microcomputer perform the following processing:
   if the microcomputer determines that the number of times of rewriting into the EEPROM is equal to or less than a first threshold indicating a predetermined number of times of rewriting, the microcomputer compares the number of accesses recorded in the history table corresponding to the recording program in a predetermined period with a second threshold indicating a predetermined number of accesses, and
   if it is determined that the number of accesses is more than the second threshold, the microcomputer outputs an instruction to rewrite the program into the EEPROM from the HDD, and
   if the microcomputer determines that the number of times of rewriting into the EEPROM is more than the first threshold, the microcomputer compares the number of times of rewriting into the EEPROM with a third threshold that is more than the first threshold, and
   if it is determined that the number of times of rewriting into the EEPROM is equal to or less than the third threshold, the microcomputer compares a total number of accesses recorded in the history table with a fourth threshold that is more than the second threshold, and
   if it is determined that the total number of accesses is more than the fourth threshold, the microcomputer outputs an instruction to rewrite the program into the EEPROM,
   if it is determined that the number of times of rewriting into the EEPROM is more than the third threshold, the microcomputer compares the number of accesses to the program recorded in the HDD with a fifth threshold that is more than the third threshold, and
   if it is determined that the number of times of rewriting is equal to or less than the fifth threshold, the microcomputer compares the number of times of rewriting with a sixth threshold that is more than the fourth threshold, and
   if it is determined the total number of accesses is more than the sixth threshold, the microcomputer outputs an instruction to rewrite the program into the EEPROM, and
   if it is determined that the total number of accesses is more than the fifth threshold, the microcomputer compares the total number of accesses with a seventh threshold that is more than the sixth threshold, and
   if it is determined that the total number of accesses is more than the seventh threshold, the microcomputer outputs an instruction to rewrite the program into the EEPROM, and
   the program that is determined to be rewritten into the EEPROM by the microcomputer is temporarily recorded in a Random-access memory and when the number of the programs recorded in the RAM reaches a predetermined number, the microcomputer outputs an instruction to rewrite the program into the EEPROM.

2. A recording device, comprising:

a first memory for recording a predetermined program and while limiting a number of times for rewriting; and a second memory for recording the predetermined program;

the recording device allows a recorded program to be transferred between the first memory and the second memory based on an instruction from a microcomputer;

the second memory includes a plurality of language programs that are recorded that correspond to a set of respective destinations and an image menu constituting an image on a menu screen as an initial setting in order to chance a use language on the menu screen for each destination, the microcomputer creating a history table for recording a use history table in which a name of the program, a recording location, access date and time, and a number of accesses each time the program recorded in the second memory is accessed, the first memory records a rewriting program that makes the microcomputer perform determination whether the program recorded in the second memory is rewritten into the first memory by the microcomputer comparing the number of times of rewriting into the first memory and the data of the history table with predetermined thresholds, and the rewriting program makes the microcomputer perform the following processing:

if the microcomputer determines that the number of times of rewriting into the first memory is equal to or less than a first threshold indicating a predetermined number of times of writing, the microcomputer compares the number of accesses recorded in the history table corresponding to the recording program in a predetermined period with a second threshold indicating a predetermined number of accesses, and if it is determined that the number of accesses is more than the second threshold, the microcomputer outputs an instruction to rewrite the program into the first memory from the second memory, and if the microcomputer determines that the number of times of rewriting into the first memory is more than the first threshold, the microcomputer compares the number of times of writing into the first memory with a third threshold that is more that the first threshold, and if it is determined that the number of times of rewriting into the first memory is equal to or less that the third threshold, the microcomputer compares a total number of accesses recorded in the history table with a fourth threshold that is more than the second threshold, and if it is determined that the total number of accesses is more than the fourth threshold, the microcomputer outputs an instruction to rewrite the program into the first memory, if it is determined that the number of times of rewriting into the first memory is more that the third threshold, the microcomputer compares the number of accesses to the program recorded in the second memory with a fifth threshold that is more that the third threshold, and if it is determined that the number of times of rewriting is equal to or less than the fifth threshold, the microcomputer compares the number of times of rewriting with a sixth threshold that is more than the fourth threshold, and if it is determined the total number of accesses is more than the sixth threshold, the microcomputer outputs an instruction to rewrite the program into the first memory, and if it is determined that the total number of accesses is more than the fifth threshold, the microcomputer compares the total number of accesses with a seventh threshold that is more than the sixth threshold, and if it is determined that the total number of accesses is more than the seventh threshold, the microcomputer outputs an instruction to rewrite the program into the first memory, and the program that is determined to be rewritten into the first memory by the microcomputer is temporarily recorded in a random-access memory and when the number of the programs recorded in the RAM reaches a predetermined number, the microcomputer outputs an instruction to rewrite the program into the first memory.

* * * * *